United States Patent [19]
Weier et al.

[11] Patent Number: 6,108,266
[45] Date of Patent: Aug. 22, 2000

[54] MEMORY UTILIZING A PROGRAMMABLE DELAY TO CONTROL ADDRESS BUFFERS

[75] Inventors: William Robert Weier; Ray Chang; Glenn Starnes, all of Austin, Tex.

[73] Assignee: Motorola, Inc., Schaumburg, Ill.

[21] Appl. No.: 09/428,440

[22] Filed: Oct. 28, 1999

[51] Int. Cl.[7] ........................................ G11C 8/00
[52] U.S. Cl. .................... 365/230.08; 365/225.7; 365/230.06
[58] Field of Search ................ 365/194, 230.08, 365/189.05, 96, 225.7, 230.06, 233

[56] References Cited

U.S. PATENT DOCUMENTS

| 5,289,413 | 2/1994 | Tsuchida et al. | 365/189.02 |
| 5,321,661 | 6/1994 | Iwakiri et al. | 365/222 |
| 5,920,510 | 7/1999 | Yukutake et al. | 365/189.05 |

*Primary Examiner*—David Nelms
*Assistant Examiner*—Thong Le
*Attorney, Agent, or Firm*—James L. Clingan, Jr.

[57] ABSTRACT

A memory utilizing programmable delay circuits to control address buffers. A programmable delay device is provided for each block of a plurality of blocks of the memory device. Each block is associated with a corresponding bit array for storing data for the associated block. The delay device is used to delay activation of sense amplifiers from the time the block is selected which, in turn, corresponds to the duration of the addresses that are provided to the bit array within the block. Each of the delays within each block is programmed by a global fuse circuit, so that all of the blocks are programmed with the same delay. After fabrication of the memory device onto an integrated circuit (IC), all of the data paths within each block are measured under various voltage and temperature conditions to identify the slowest data path of all blocks of the memory device. Once a particular delay is identified for the slowest data path within the memory device, all of the programmable delays within each block are programmed with a corresponding delay. In this manner, all of the sense amplifiers within any selected blocks are activated after the programmed delay to ensure valid data. A similar delay device is provided within the clock control circuitry to pulse-width control the clock signal provided to the address buffers. The global fuse circuit used to program the delay device within each of the blocks is also used to program the delay device within the clock control circuit so that the program delay within the clock control circuit and the data blocks are essentially the same.

4 Claims, 4 Drawing Sheets

MEMORY UTILIZING A PROGRAMMABLE DELAY TO CONTROL ADDRESS BUFFERS

FIELD OF THE INVENTION

The present invention relates to memory systems and, more particularly, to a programmable delay that generates a reset signal to address buffers for a return to zero scheme to improve speed and reduce power.

BACKGROUND OF THE INVENTION

Dynamic sensing is commonly used to sense small bit-line differentials in certain types of memory systems. For example, synchronous random access memories (SRAMs) commonly use dynamic sensing. Dynamic sensing is typically implemented with dynamic amplifiers that must be precharged before a next sensing event. A reset signal, therefore, is needed to precharge the dynamic amplifiers to prepare for subsequent sensing events. A common method used to generate the reset signal is to return all of the addresses to zero, otherwise referred to as a return to zero (RTZ) scheme. The reset signal is used to reset all of the predecoders and dynamic sense amplifiers. In a typical RTZ scheme, each address buffer asserts two signals, the true address signal and its binary complement, where all of the true and complement address signals are returned to zero to effectuate the reset.

One RTZ scheme is to use the falling edge of an external clock as the reset event. Reliance on an external clock, however, is problematic and forces designers using the memory chip to meet specific timing requirements for the input clock signal. If the external clock signal has a low duty cycle and thus a short "on" pulse, the falling edge may arrive too soon and before the bit lines of the memory array can be sensed. The memory device thus malfunctions if reset too soon. On the other hand, if the external clock signal has a relatively high duty cycle, the device resets relatively late, which thereby increases power usage needlessly.

Another RTZ scheme is the use of a self-timed pulse. The width of the self-timed pulse, however, varies due to temperature, power supply and process of variations. Thus, the address buffers may be reset too soon before the data is sensed if the self-timed pulse width is too small. Alternatively, if the pulse width is too wide, the minimum cycle time is needlessly increased. The voltage and temperature dependence of a self-timed pulse causes operational changes and affects the timing of the memory, depending upon ambient conditions. A self-timed pulse is also process-dependent, where an arbitrary timing value is selected. A chosen timing period that is too short results in a significant loss of yield in the manufacturing process. A chosen timing period that is too long results in a significant increase in cycle time and unnecessary consumption of power.

The situation is made worse when attempting to create a separate control signal for sensing the dynamic amplifier because there is no tracking mechanism between the reset of the addresses and the enabling of the dynamic amplifiers. A new RTZ scheme is desired that allows for maximum time for resetting and equalization while also reducing power and improving cycle time. It is also desired to provide a memory device that works in various temperatures, power supply levels and process variations, that is not dependent upon external clock specifications and that is not subject to external clock jitter.

DESCRIPTION OF THE FIGURES

Figure 1:
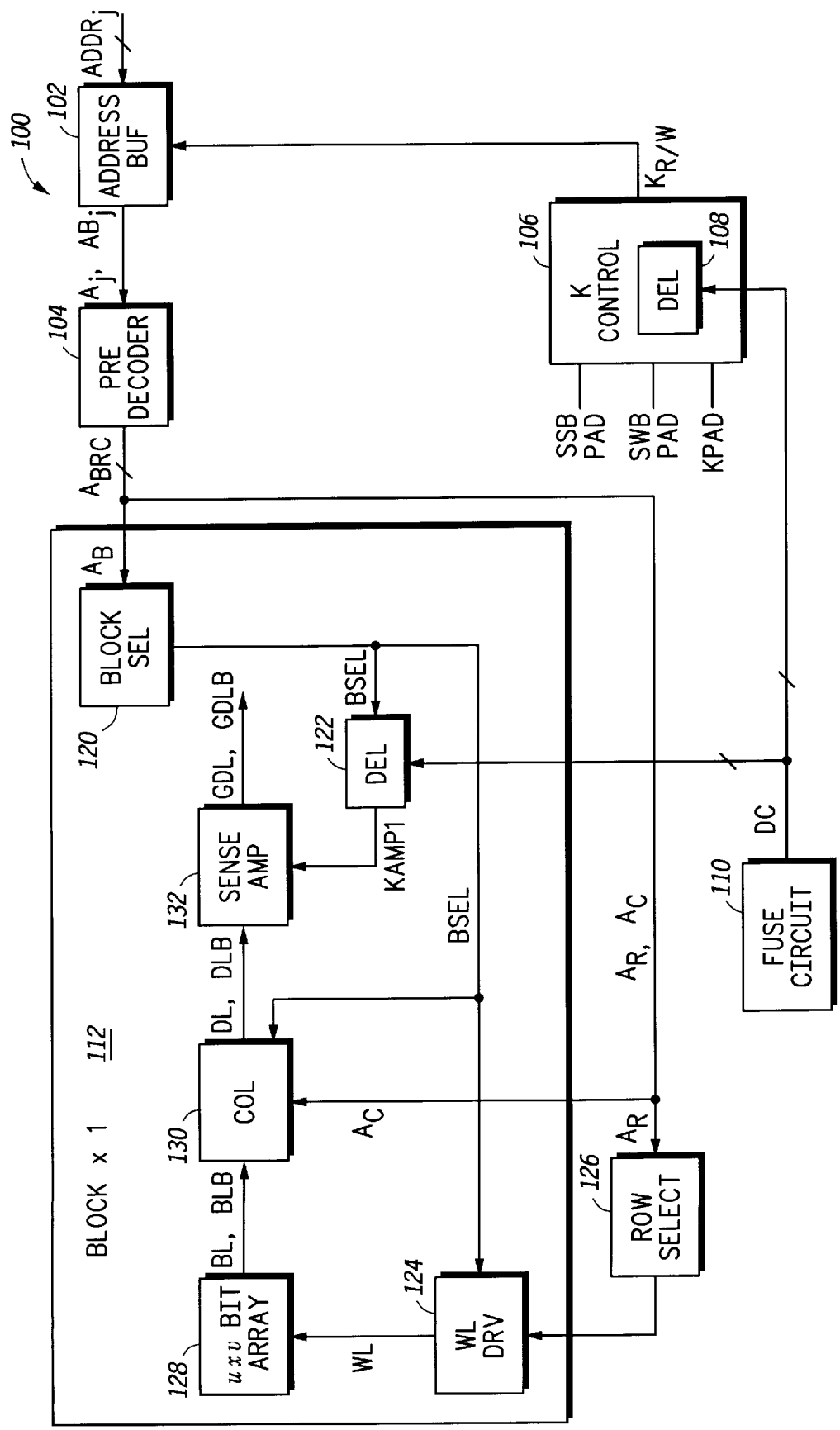
FIG. 1 is a block diagram of a representative portion of a memory device utilizing programmable delay devices according to an embodiment of the invention.

FIG. 1 is a block diagram of a representative portion of a memory device 100 implemented according to the present invention. The memory device 100 may be implemented in any type of integrated circuit (IC) or packaging as known to those skilled in the art. The memory device 100 illustrated is an eight (8) megabit, late write synchronous static RAM (SRAM) device that is operated at approximately 333 megahertz. It is understood, however, that the present invention may be applied to any type of memory device of any size and speed.

A plurality of address bits ($ADDR_j$) are provided to address buffers 102, which assert a corresponding plurality of address signals $A_j$ and address complement signals $AB_j$ to a predecoder 104. The predecoder 104 asserts several sets of address signals including block select address signals $A_B$, row address signals $A_R$, and column address signals $A_C$. The address buffers 102 are controlled by one or more read/write (R/W) clock signals collectively shown as the $K_{R/W}$ signal. The $K_{R/W}$ signal is asserted by a clock control circuit (K control) 106. An external clock signal KPAD and R/W control signals SSBPAD and SWBPAD are provided to the K control circuit 106. The K control circuit 106 includes a delay circuit 108 which receives a multibit delay code, collectively shown and referred to as the DC signals, generated by a fuse circuit 110. In the specific embodiment shown, there are eighteen (18) $ADDR_j$ address signals so that j varies from one (1) to eighteen (18). It is understood, however, that the present invention is applicable to any number of address bits.

The $A_B$, $A_R$, $A_C$ and the $D_C$ signals are provided to a block circuit 112 of the memory device 100. Although only one block circuit 112 is shown, the memory device 100 may include a plurality of such block circuits 112 to implement the particular size of the memory device 100. In one embodiment, for example, the memory device 100 includes eight data arrays, conveniently called octants, where each octant includes 32 data blocks similar to the data block 112. In any given access of the memory device 100, four of the eight octants supply nine (9) bits of data, each for a total of 36 bits. Thus, each of four selected data blocks, each similar to the data block 112, provides nine bits of data. Only one data block 112 is shown for purposes of clarity.

Within the data block 112, the $A_B$ signals are provided to a block select circuit 120, which generates a block select signal BSEL to another delay circuit 122 and to a word line driver (WL DRV) 124. The delay circuit 122 is similar in function to the delay circuit 108 within the K control circuit 106, and receives the DC signals from the fuse circuit 110. In this manner, the delay circuits 108 and 122 receive the same delay code via the DC signals and thus effectively generate approximately the same amount of delay between their inputs and outputs as further described below. The $A_R$ signals are provided to a row select circuit 126, which generates corresponding word line signals to the word line driver 124. The word line driver 124 generates word line signals, WL to a u by v data array 128 within the data block 112. In the embodiment shown, the array 128 is preferably 72×512 bits for a total of 36K bits, where K=1024 bits. Upon assertion of the WL signals to the data array 128, the data array 128 asserts bit line signals denoted BL and bit line complement signals denoted BLB to a column decoder 130, which receives the $A_C$ address signals and the BSEL signal. The column decoder 130 selects from among the BL and BLB signals to generate corresponding data line signals denoted DL and data line complement signals denoted DLB to a sense amplifier 132. The sense amplifier 132 is activated by a clock control signal KAMP1 asserted by the delay circuit 122. Upon assertion of the KAMP1 signal, the sense amplifier 132 senses the data on the DL, DLB signals and generates corresponding global data line signals denoted GDL and their complement signals denoted GDLB.

The delay circuit 108 within the K control circuit 106 determines the width of the clock pulse on the $K_{R/W}$ clock signal initiated in response to assertion of the KPAD signal. The delay circuit 108 is utilized by the K control circuit 106 to control the pulse width of the $K_{R/W}$ signal to the address buffers 102. This in turn controls the pulse width of the address signals $A_j/AB_j$ provided to the predecoders 104. Further, the pulse widths of the $A_B$, $A_R$ and $A_C$ address signals as well as the WL signals provided to the data array 128 are generally determined by the delay circuit 108. The BSEL signal is ultimately initiated by assertion of the external clock signal KPAD after delays through the K control circuit 106, the address buffers 102, the predecoder 104 and the block select circuit 120. The KAMP1 signal is asserted by the delay circuit 122 in response to the assertion of the BSEL signal after being delayed through the delay circuit 122. In this manner, the sense amplifier 132 is activated in response to the KAMP1 signal after the delay through the delay circuit 122. Fuse circuit 110 is programmed to determine the length of the delay. Also, the pulse width of the $A_B$, $A_R$ and $A_C$ address signals provided to the data block 112 and the activation of the sense amplifier 132 after the addresses have been provided to the data array 128 are generally controlled by the same amount of delay via the delay circuit 108 as programmed by the fuse circuit 110. Thus, the address signals are asserted only as long as necessary until the sense amplifier 132 is activated to sample the resultant data.

After the memory device 100 has been fully processed and fabricated onto a corresponding IC, it is tested to determine its timing characteristics. In particular, an address is asserted to the memory device 100 via the $ADDR_j$ signals, the SSBPAD, SWBPAD, and KPAD signals are generated to write data into and read data from all of the memory blocks, including the memory block 112. Such testing is preferably performed at various frequency levels as well as under various conditions of temperature and voltage. The bit line data generated by the data arrays, such as the data array 128 on the bit lines BL, BLB, as well as the data lines DL, DLB, are sensed and measured. These tests are performed to determine the appropriate amount of delay of the delay circuit 122 in response to assertion of the BSEL signal to ensure that all of the sense amplifiers of each block, including the sense amplifier 132, are activated at the appropriate time. The determined delay must take into account the slowest data path of each of the data arrays within each block of all octants of the memory device 100. In this manner, the appropriate delay through the delay circuit 122 is determined so that the KAMP1 signal to the sense amplifier 132 is asserted at the appropriate time to ensure that the data lines DL, DLB have enough differential voltage to sense the correct data from the data array 128. Once the delay is determined, fuses within the fuse circuit 110 are blown to program the delay circuit 122 with the determined delay. Since the delay circuit 108 is similar to the delay circuit 122 and both receive the same DC signals, the delay circuit 108 is programmed with approximately the same delay as the delay circuit 122.

Fuse-blowing is common in the memory art. Memories typically have redundancy that is selectively implemented by fuse-blowing. Further, it is now becoming common to identify individual integrated circuits based on lot number, location on the wafer, and other information. This information is also placed on the IC and thus encoded by fuse-blowing. Thus, fuse-blowing may actually occur in such a case on every device that is made. In the case of redundancy in a memory, it would be only in those cases where redundancy is required. The technology for implementing redundancy, however, is very reliable so that the risk of using fuse-blowing technology is minimal even though it is put into effect on every device. As described herein, the memory device 100 is further tested to determine the minimum amount of time to activate the sense amplifiers, including the sense amplifier 132, to account for the slowest delays through the data arrays, including the data array 128. Once so determined, the fuse circuit 110 is blown to establish the proper delay of the delay circuit 122. A similar type delay device is provided within each block of the memory device 100, so that all delay devices across all of the octants and within each block of the memory device 100 are programmed with the same amount of delay. In this manner, an optimum amount of delay is programmed based upon the particular fabricated IC after being tested.

Figure 2:
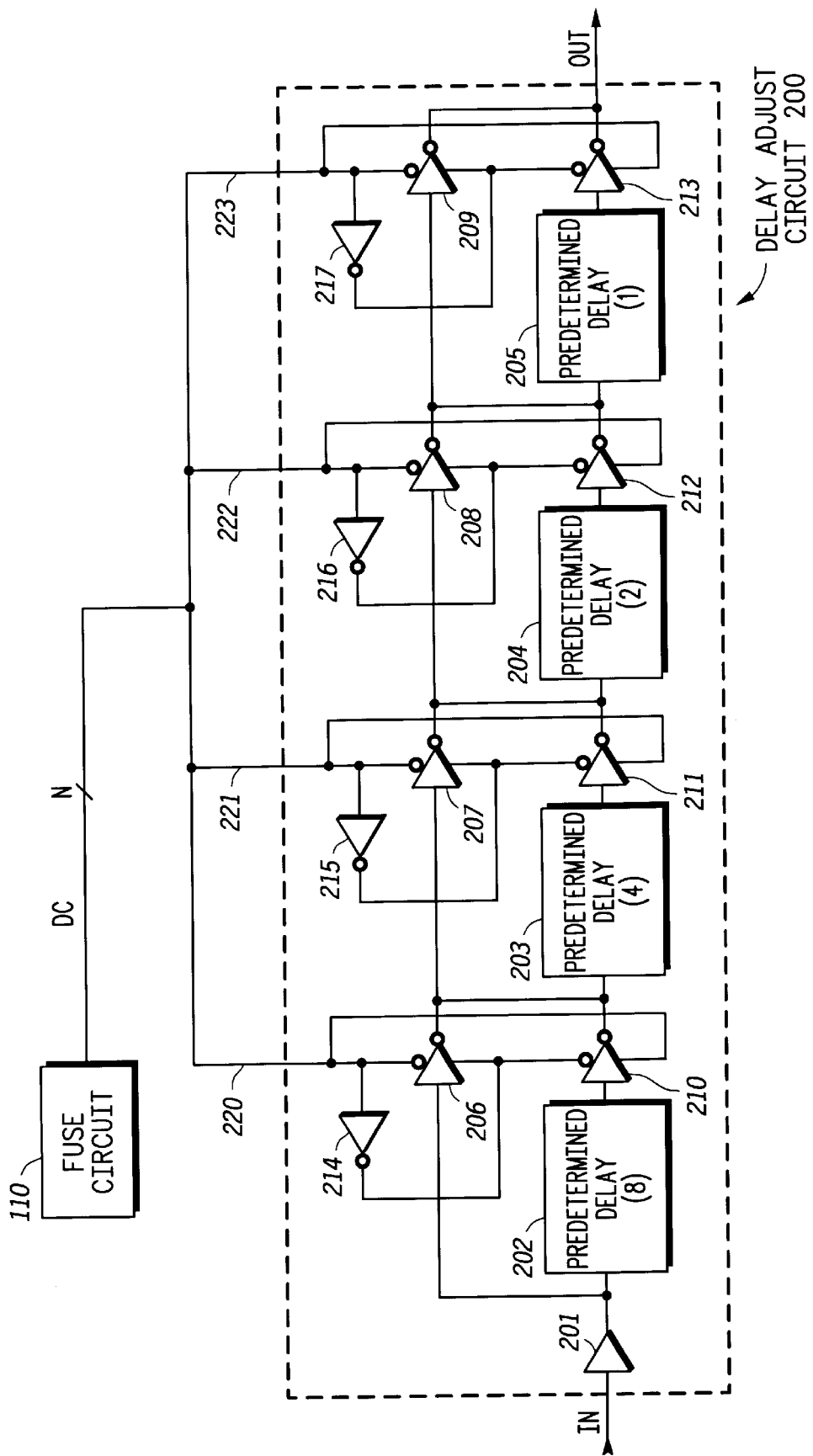
FIG. 2 is a block diagram of an exemplary programmable delay circuit according to an embodiment of the invention that may be utilized for the delay circuits of FIG. 1.

FIG. 2 is a schematic diagram of one embodiment of a programmable delay circuit 200 which may be used for either or both of the delay circuits 108, 122 of the memory device 100. The delay circuit 200 includes predetermined delay circuits 202–205, tri-stateable buffers 206–213, inverters 214–217 and an input buffer 201. The input buffer 201 could be replaced with input and output inverting buffers. The buffer 201 receives an input signal labeled IN and asserts its output to the input of the predetermined delay circuit 202 and to the input of tri-stateable buffer 206. The output of predetermined delay circuit 202 is provided to the input of the tri-stateable buffer 210. The output of the tri-stateable buffer 210 is provided to the input of the predetermined delay circuit 203 and to the input of the tri-stateable buffer 207. The output of the predetermined delay circuit 203 is provided to the input of the tri-stateable buffer 211. The output of the tri-stateable buffer 211 is provided to the input of the predetermined delay circuit 204 and to the input of the tri-stateable buffer 208. The output of the predetermined delay circuit 204 is provided to the input of the tri-stateable buffer 212. The output of the tri-stateable buffer 212 is provided to the input of the predetermined delay circuit 205 and to the input of the tri-stateable buffer 209. The output of the predetermined delay circuit 205 is provided to the input of the tri-stateable buffer 213. The output of the tri-stateable buffer 213 is coupled to the output of the tri-stateable buffer 209 and provides an output signal labeled OUT. The output of the tri-stateable buffer 206 is provided to the input of the tri-stateable buffer 207. The output of the tri-stateable buffer 207 is provided to the input of the tri-stateable buffer 208. The output of the tri-stateable buffer 208 is provided to the input of the tri-stateable buffer 209.

The fuse circuit 110 provides N delay code signals, collectively shown as the DC signals, to respective inputs to program the delay circuit 200. In the embodiment shown, four DC signals 200–223 are shown, although it is understood that any number of delay code signals may be used in an alternative embodiment, depending upon the resolution of the programmable delay. The four delay signals 220–223 provide $2^4$ or sixteen (16) different delay levels, which is determined to be acceptable for the delay circuits 106 and 122 of the memory circuit 100. The code signal 220 is provided to the input of the inverter 214, to the inverting control input of the tri-stateable buffer 206, and to the noninverting control input of the tri-stateable buffer 210. The code signal 221 is provided to the input of the inverter 215, to the inverting control input of the tri-stateable buffer 207, and to the noninverting control input of the tri-stateable buffer 211. The code signal 222 in provided to the input of the inverter 216, to the inverting control input of the tri-stateable buffer 208, and to the noninverting control input of the tri-stateable buffer 212. The code signal 223 is provided to the input of the inverter 217, to the inverting control input of the tri-stateable buffer 209, and to the noninverting control input of the tri-stateable buffer 213. The output of the inverter 214 is provided to the noninverting control input of the tri-stateable buffer 206 and to the inverting control input of the tri-stateable buffer 210. The output of the inverter 215 is provided to the noninverting control input of the tri-stateable buffer 207 and to the inverting control input of the tri-stateable buffer 211. The output of the inverter 216 is provided to the noninverting control input of the tri-stateable buffer 208 and to the inverting control input of the tri-stateable buffer 212. The output of the inverter 217 is provided to the noninverting control input of the tri-stateable buffer 209 and to the inverting control input of the tri-stateable buffer 213.

The delay circuit 200 includes four different delays that are in increments that are ratioed with respect to each other. In this case, assume that the predetermined delay circuit 205 has a reference delay parenthetically shown as a delay of (1). The predetermined delay circuit 204 has a delay which IS double (2) that of the predetermined delay circuit 205, the predetermined delay circuit 203 has four times (4) the delay of the predetermined delay circuit 205 and the predetermined delay circuit 202 has eight times (8) the delay of the predetermined delay circuit 205. Because there are four binary bits coming in on the DC signals, the four delays are selected according to these four bits and are arranged so that any amount of delay from zero to fifteen (16 levels of delay) can be selected which takes into account all sixteen options available from the four binary bits.

The operation is that any of the predetermined delay circuits 202–205 can be bypassed or used in any combination. The delay circuits 202–205 correspond to the binary code signals 220–223, respectively. When a particular binary signal is logic high, the corresponding delay is enabled. For example, a delay of ten can be achieved by applying binary signals 220 and 222 in a logic high state and the binary code signals 221 and 223 in a logic low state. This has the effect of passing through predetermined delay circuit 202 and the predetermined delay circuit 204 while the predetermined delay circuits 203 and 205 are bypassed. By being powers of two and using tri-stateable drivers between the delays, the delays give all the options, linearly, from zero to fifteen. This is also compact because it integrates the decoding circuitry into the delay path such that it results in a relatively small area. This type of programmable delay is beneficial in these ways but is not necessary. Other types of programmable delays known in the art may be substituted for the delay circuit 200.

Other options are available for choosing the ratios of the delays than the binary one, two, four, eight approach. There may be situations where nonlinear delays are used based on the bit selection. There may be a situation where the choice is either a significant amount of delay or nearly no delay, but in either case there is a need for fine adjustment. In such a case, the predetermined delay circuit 202 could be chosen to be a relatively large number that would be an estimate of the delay for the case where the large delay is desired. The others' delay would remain the same, such as one, two and four relationship, to cover the fine resolution for either the large delay or near-zero delay case. In any event, there may be other combinations of delay that would be more useful and that could be selected by the DC signals.

Figure 3:
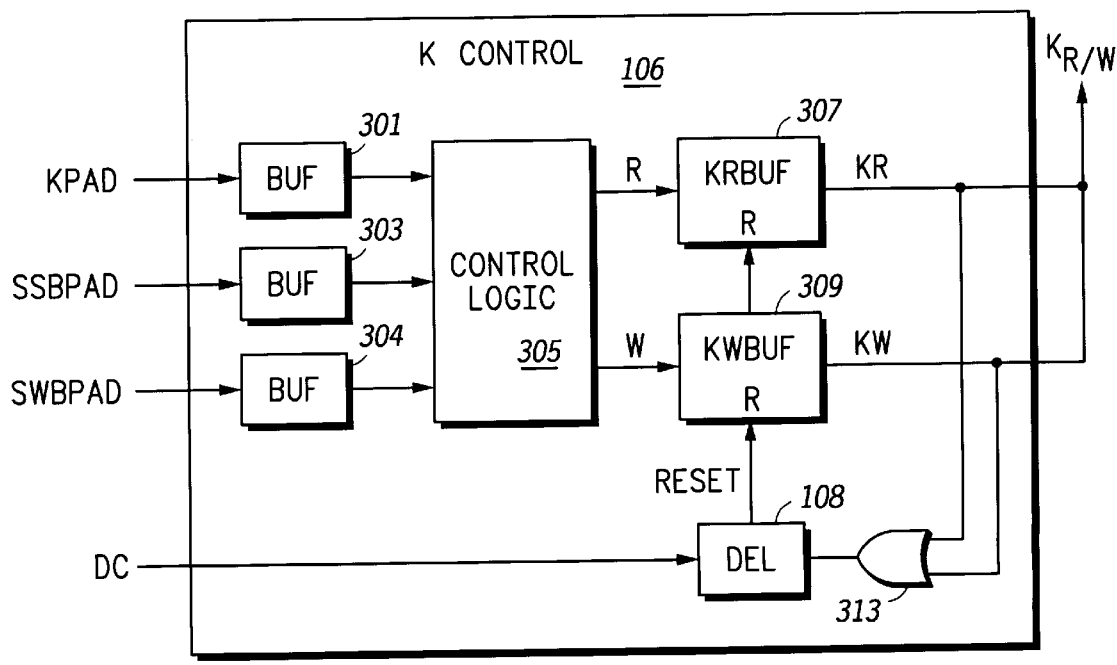
FIG. 3 is a block diagram of the clock control circuit of FIG. 1 implemented according to an embodiment of the invention.

FIG. 3 is a schematic block diagram of the K control circuit 106 shown in FIG. 1. The external clock KPAD is provided to the input of a buffer 301, having its output provided to control logic 305. The read/write control signals include a synchronized select bar signal denoted SSBPAD and a synchronized write bar signal denoted SWBPAD. The bar or "B" denotes negative logic. The SSBPAD signal is asserted low to indicate a memory access for either read or write, and the SWBPAD signal is asserted low for a write cycle and asserted high for a read cycle. The SSBPAD signal is provided to a buffer 303, having its output provided to the control logic 305. The SWBPAD signal is provided to a buffer 304, having its output provided to the control logic 305. The control logic 305 detects a memory access cycle via the SSBPAD signal and determines a read or write cycle based on the SWBPAD signal. For a read cycle, the control logic 305 asserts a read signal R synchronous with assertion of the KPAD clock signal. For a write cycle, the control logic 305 asserts a write signal W synchronous with assertion of the clock signal KPAD. The R signal is provided to the input of a buffer KRBUF 307, which asserts an output read clock signal denoted KR. The W signal is provided to the input of a write buffer KWBUF 309, which asserts an output write signal KW. The KR and KW signals are collectively referred to as the $K_{R/W}$ signal, which is provided to the address buffers 102 as previously described. The KR and KW signals are provided to the respective inputs of a two-input OR gate 313, having its output provided to the input of the delay circuit 108. The delay circuit 108 also receives the DC signals from the fuse circuit 110 as previously described. The output of the delay circuit 108 asserts a signal RESET, which is provided to the reset inputs of the read and write buffers KRBUF 307 and KWBUF 309. In this embodiment, one delay circuit is used for both KRBUF and KWBUF, but it is known that two delay circuits could be used, in other words one for KRBUF and one for KWBUF.

The KRBUF circuit 307 asserts the KR signal in response to assertion of the R signal at its input. Likewise, the KWBUF circuit 309 asserts the KW signal in response to assertion of the W signal at its input. Assertion of either of the KR and KW signals is detected by the delay circuit 108 via the OR gate 313. After the programmed delay through the delay circuit 108, the delay circuit 108 asserts the RESET signal, which resets the KRBUF circuit 307 and the KWBUF circuit 309. In this manner, whichever of the KR or KW signals is asserted, in response to assertion of the KPAD signal during a memory access, the asserted clock signal has a pulse width that is approximately equal to the delay programmed into the delay circuit 108. Concomitently, the $K_{R/W}$ signal has a pulse width controlled by the delay circuit 108 for both read and write cycles.

Figure 4:
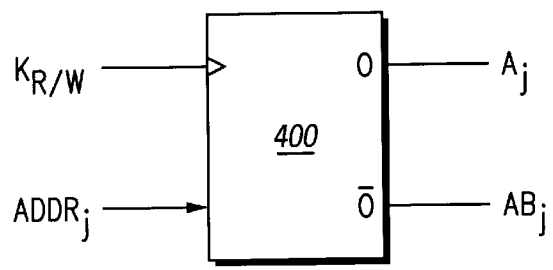
FIG. 4 is a block diagram of a return to zero (RTZ) address buffer utilized in the memory device of FIG. 1.

FIG. 4 is a simplified block diagram of a pulse width controlled address buffer implemented according to a return-to-zero (RTZ) scheme. The $K_{R/W}$ signal is provided to the clock input of the address buffer 400, which also receives a respective one of the $ADDR_j$ signals at its data input. The address buffer 400 asserts a corresponding address signal $A_j$ at its noninverting output and asserts a complementary address bit $AB_j$ at its inverting output. When the $K_{R/W}$ clock signal is low, the address signals at the output $A_j$, $AB_j$ are both asserted low according to the RTZ scheme. When the $K_{R/W}$ clock signal goes high, the address buffer 400 asserts the $A_j$ output to correspond with the input address bit asserted on the $ADDR_j$ input signal. The complementary address bit $AB_j$ is asserted to the opposite logic level of the $A_j$ address bit. When the $K_{R/W}$ clock signal goes low, both of the address bits $A_j$, $AB_j$ return back to zero or logic low. In this manner, only one of the address bits $A_j$, $AB_j$ is asserted high in response to the $K_{R/W}$ signal going high and only for so long as the case of $K_{R/W}$ signal remains high. Therefore, the resultant pulse asserted on either of the address bits $A_j$, $AB_j$ has approximately the same duration as the input clock pulse of the $K_{R/W}$ signal.

Figure 5:
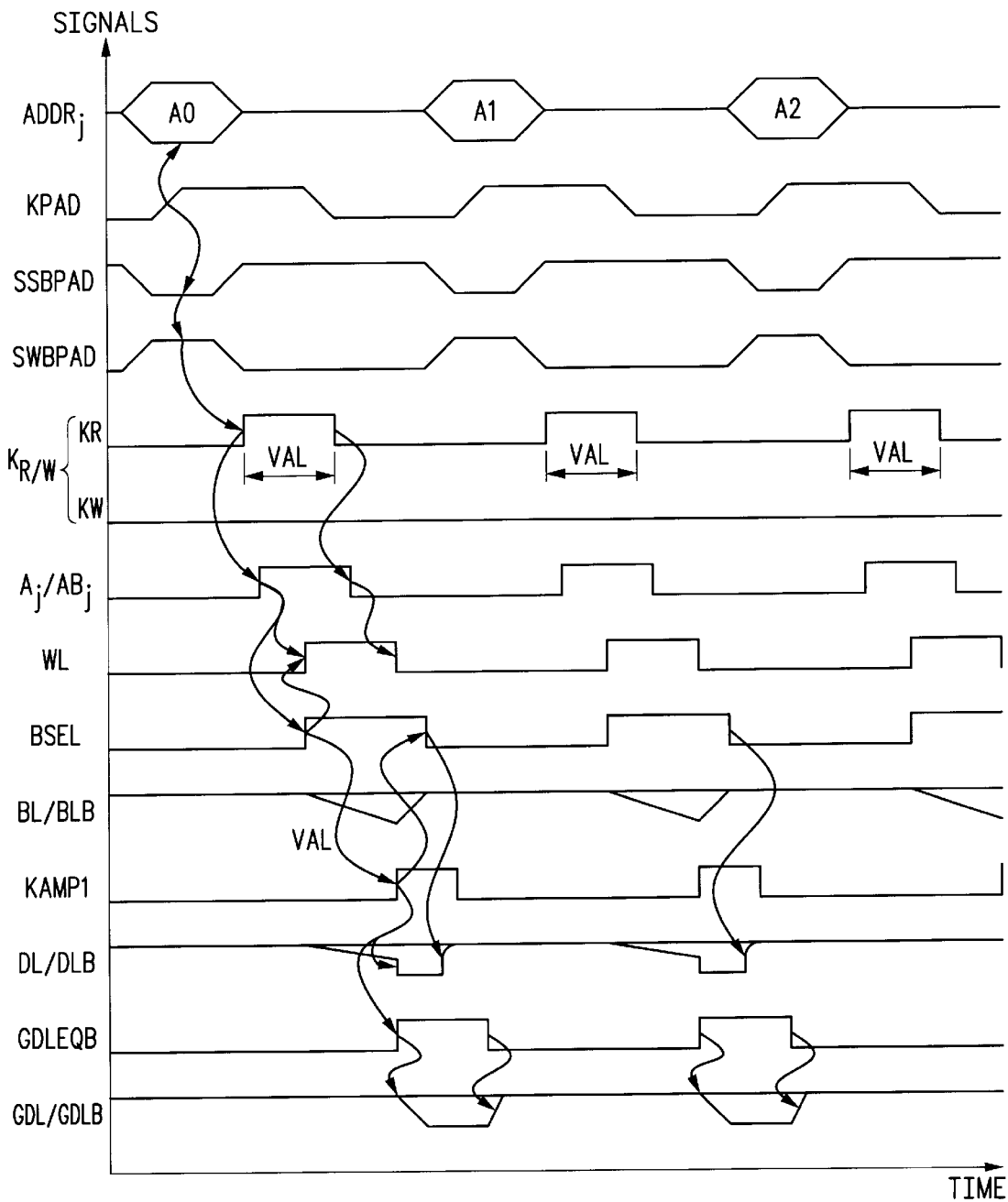
FIG. 5 is a timing diagram illustrating operation of the memory device of FIG. 1.

FIG. 5 is a timing diagram illustrating a read operation of the memory circuit 100 shown in FIG. 1. An address, denoted AO appears, on the input $ADDR_j$ signals and the SSBPAD signal is asserted low to denote a memory access. The SWBPAD signal is asserted high to denote a read cycle. The KPAD signal is then asserted high to sample the SSBPAD, SWBPAD and $ADDR_j$ signals to detect the read cycle and corresponding addresses. The KR signal is thus asserted high in response and has a pulse width, denoted VAL, as determined by the delay circuit 108. Assertion of the KR signal causes a corresponding pulse on both of the $A_j$, $AB_j$ address signals from the address buffers 102, which are provided to the predecoder 104. The predecoder 104 develops the $A_B$, $A_C$ and $A_R$ signals, which ultimately resolve in assertion of the corresponding WL signal to the data array 128 for selected blocks as determined by the $A_B$ address signals. The pulse on the $A_B$ signals also causes the BSEL signal to be asserted high by the block select circuit 120 for selected blocks. The word line driver 124 asserts the corresponding WL signal to the data array 128, which begins developing data on the bit lines BL/BLB in response. The column decoder 130 selects the bit lines BL, BLB and begins asserting data on the corresponding DL, DLB data lines at its output.

Assertion of the BSEL signal by the block select circuit 120 initiates the programmed delay of the delay circuit 122. Thus, after the programmed delay VAL, the delay circuit 122 asserts the KAMP1 signal to activate the sense amplifier 132. Assertion of the KAMP1 signal causes the data on the data lines DL, DLB to separate and develop the appropriate data. A global equalizer signal, referred to as GDLEQB, is also asserted in response to the KAMP1 signal, which causes the global data line equalization circuit (not shown) to turn off and the sense amplifier 132 to quickly develop data on the GDL, GDLB global data lines. The data asserted on the GDL, GDLB global data lines is thus available for detection and sampling by other amplifiers (not shown) of the memory device 100.

The KR signal has a pulse duration of VAL as determined by the delay circuit 108. After the VAL delay, the KR signal is deasserted low, causing return to zero on the address signals $A_j$, $AB_j$. The RTZ of the $A_j$, $AB_j$ signals in turn causes negation of the WL signals by the word line driver 124. When the KAMP1 signal is asserted, the block select circuit 120 deasserts the BSEL signal, which deactivates the column decoder 130 so that the data lines DL, DLB return to an initialized state. The GDLEQB signal has a predetermined pulse width and, when negated, causes the GDL, GDLB global data lines to return to an initialized state.

What is claimed is:

1. A memory, comprising:

an address buffer having an input for receiving an address signal, a first output for providing a true address signal, a second output for providing complementary address signal, and a control input;

a plurality of fuses for providing a delay program signal;

a clock circuit having an input which receives an external clock and an output;

a programmable pulse width circuit having a first input coupled to the output of the clock circuit, a second input for receiving the delay program signal, and an output coupled to the control input of the address buffer;

word line drivers enabled in response to enable signals;

sense amplifiers enabled in response to delayed enable signals; and programmable delay circuits which provide the delayed enable signals in response to the enable signals wherein the programmable delay circuits have a delay which is the same as a width of a pulse gene rated by the programmable pulse width circuit;

wherein the address buffer causes both the true and complementary address signals to be at the same logic state in response to the control input being disabled.

2. In a memory having address buffers which have an input for receiving an address signal, a first output for providing a true address signal, a second output for providing complementary address signal; and a control input; having blocks and each block selected by a corresponding block select signal; and, in response to entering an active cycle of the memory, providing active address signals which enable decoders for selecting bit cells, a circuit comprising:

a plurality of fuses for providing a delay program signal indicating a delay;

a clock circuit having an input which receives an external clock which indicates when the active cycle has been entered, and an output;

a programmable pulse width circuit having a first input coupled to the output of the clock circuit, a second input for receiving the delay program signal, and an output coupled to the control inputs of the address buffers;

programmable delay circuits responsive to the corresponding block select signals, said programmable delays having a delay responsive to the delay program signal;

sense amplifiers enabled by the programmable delay circuits; and word line drivers enabled by the block select signals.

3. The memory of claim 2 wherein the programmable pulse width circuit is programmed to have a pulse width equal to the delay of the programmable delay circuits.

4. A memory, comprising:

an address buffer;

a memory array responsive to the address buffer;

a first programmable delay circuit coupled to the address buffer;

a word line driver coupled to the address buffer and the memory array and enabled in response to an enable signal;

a sense amplifier coupled to the memory array and enabled in response to a delayed enable signal;

a second programmable delay circuit which provides the delayed enable signal in response to the enable signal; and a selection circuit, coupled to the first and second programmable delay circuits, that has an output which provides a selection signal which indicates a delay.

* * * * *

UNITED STATES PATENT AND TRADEMARK OFFICE
CERTIFICATE OF CORRECTION

PATENT NO.   :   6,108,266
DATED        :   August 22, 2000
INVENTOR(S)  :   William Robert Weier, et al.

It is certified that an error appears in the above-identified patent and that said Letters Patent are hereby corrected as shown below:

Cover page:
  Add "A" before MEMORY in the title;

Claim 1, column 8, line 13,
  Insert a comma between signals and wherein;

Claim 1, column 8, line 15,
  Change -- gene rated -- to "generated".

Signed and Sealed this

Twenty-fourth Day of April, 2001

Attest:

NICHOLAS P. GODICI

*Attesting Officer*  *Acting Director of the United States Patent and Trademark Office*